(12) United States Patent
Lang et al.

(10) Patent No.: US 8,791,490 B2
(45) Date of Patent: Jul. 29, 2014

(54) ORGANIC LIGHT-EMITTING DIODE, CONTACT ARRANGEMENT AND METHOD FOR PRODUCING AN ORGANIC LIGHT-EMITTING DIODE

(75) Inventors: Erwin Lang, Regensburg (DE); Dirk Becker, Langquaid (DE); Thomas Dobbertin, Regensburg (DE); Markus Klein, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 222 days.

(21) Appl. No.: 12/867,241

(22) PCT Filed: Feb. 16, 2009

(86) PCT No.: PCT/DE2009/000217
§ 371 (c)(1),
(2), (4) Date: Nov. 15, 2010

(87) PCT Pub. No.: WO2009/106040
PCT Pub. Date: Sep. 3, 2009

(65) Prior Publication Data
US 2011/0198657 A1 Aug. 18, 2011

(30) Foreign Application Priority Data

Feb. 29, 2008 (DE) .......................... 10 2008 011 867
Apr. 25, 2008 (DE) .......................... 10 2008 020 816

(51) Int. Cl.
*H01L 33/00* (2010.01)
*H01L 33/62* (2010.01)
*H01L 33/48* (2010.01)
*H01L 33/32* (2010.01)
*H01L 33/38* (2010.01)

(52) U.S. Cl.
CPC .............. *H01L 33/62* (2013.01); *H01L 33/486* (2013.01); *H01L 2224/48091* (2013.01); *H01L 33/32* (2013.01); *H01L 33/38* (2013.01)
USPC .................................... 257/99; 257/E33.063

(58) Field of Classification Search
CPC .................. H01L 33/62; H01L 33/486; H01L 2224/48091; H01L 33/32; H01L 33/38
USPC .............................................. 257/99, E33.063
See application file for complete search history.

(56) References Cited

U.S. PATENT DOCUMENTS 6,448,710 B1 9/2002 Asai et al.
7,537,947 B2 5/2009 Smith et al.
(Continued)

FOREIGN PATENT DOCUMENTS

CN 1698088 A 11/2005
CN 1728898 A 2/2006
(Continued)

*Primary Examiner* — Anthony Ho
(74) *Attorney, Agent, or Firm* — Cozen O'Connor

(57) ABSTRACT

An organic light-emitting diode (1), comprising a layer stack (2) for emitting electromagnetic radiation (6). An electrically conductive first connection layer (4) is arranged on a first surface of the layer stack (2) and an electrically conductive second connection layer (5) at least predominantly transparent to a characteristic wavelength of the emittable electromagnetic radiation (6) is arranged on a second surface of the layer stack (2). The organic light-emitting diode is characterized by a conductive contact structure (7) arranged on the opposite side of the first connection layer (4) from the layer stack, which contact structure is connected electrically to the second connection layer (5) in the region of a plurality of openings (12) in the first connection layer (4). Also disclosed is a contact arrangement (15) for a two-dimensional, optically active element and to a method of producing organic light-emitting diodes (1).

11 Claims, 4 Drawing Sheets

(56) References Cited

U.S. PATENT DOCUMENTS

| | | |
|---|---|---|
| 2004/0152240 A1* | 8/2004 | Dangelo ............... 438/122 |
| 2005/0258436 A1 | 11/2005 | Arai |
| 2005/0270464 A1 | 12/2005 | Seo et al. |
| 2006/0091126 A1 | 5/2006 | Baird et al. |
| 2007/0077349 A1* | 4/2007 | Newman et al. ............ 427/66 |
| 2007/0152574 A1 | 7/2007 | Choi et al. |
| 2008/0265759 A1 | 10/2008 | Young et al. |

FOREIGN PATENT DOCUMENTS

| | | |
|---|---|---|
| DE | 10 2006 052 029 | 3/2008 |
| EP | 1 187 212 | 3/2002 |
| EP | 1 418 634 | 11/2002 |
| EP | 1 469 450 | 10/2004 |
| EP | 1 717 877 | 4/2006 |
| EP | 1 786 038 | 11/2006 |
| GB | 2 381 658 | 3/2004 |
| JP | 2002 299047 | 10/2002 |
| JP | 2005-038651 | 2/2005 |
| JP | 2005-122910 | 5/2005 |
| JP | 2005-332773 | 12/2005 |
| TW | 2007-31591 | 12/1995 |
| WO | WO 03/021340 A3 | 3/2003 |

\* cited by examiner

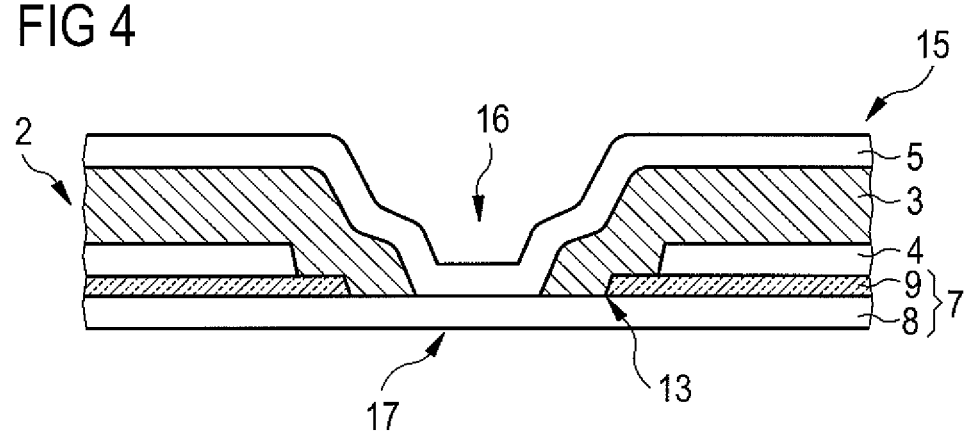
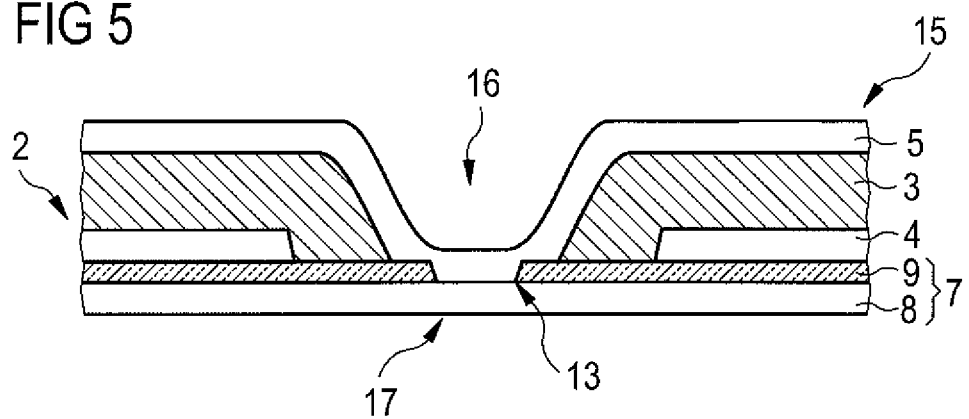

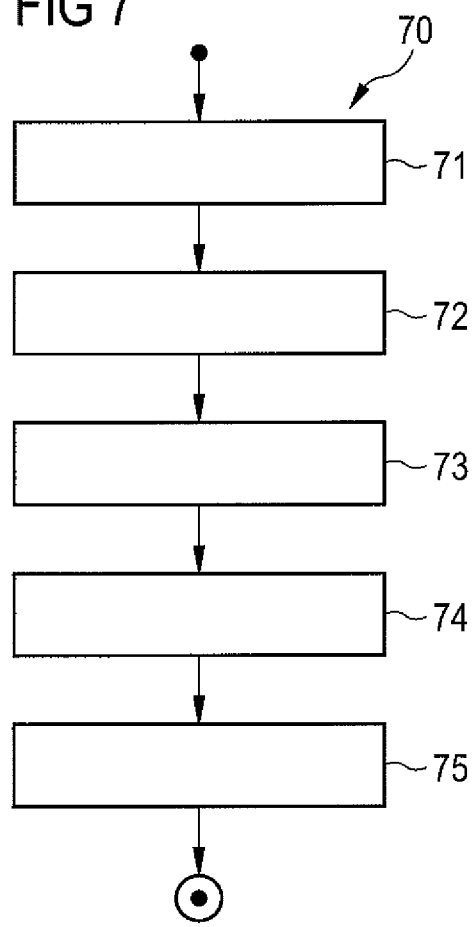

ORGANIC LIGHT-EMITTING DIODE, CONTACT ARRANGEMENT AND METHOD FOR PRODUCING AN ORGANIC LIGHT-EMITTING DIODE

RELATED APPLICATIONS

This is a U.S. national stage of application No. PCT/DE2008/000217, filed on Feb. 16, 2009.

This application claims the priority of German application no. 10 2008 011 867.2 filed Feb. 29, 2008 and 10 2008 020 816.7 filed Apr. 25, 2008, the entire content of which is hereby incorporated by reference.

FIELD OF THE INVENTION

The invention relates to electronic components with a two-dimensional, optically active area in general and to organic light-emitting diodes in particular. In this respect, two-dimensional means that the optically active element extends substantially further in a first and second spatial direction defining the first and second surfaces than in the remaining third spatial direction.

BACKGROUND OF THE INVENTION

One problem of conventional light-emitting diodes is uniform feed of an operating voltage. Conventionally the operating voltage for an organic layer stack is applied to edge areas of two connection layers. While electrical feed via a metallic connection layer is relatively non-critical due to the good conductivity of metal, a voltage applied to another type of connection layer, in particular a transparent layer, drops from the edge. The reason for this is that such layers exhibit low transverse conductivity compared with metallic layers and thus do not conduct the supply voltage as well as a metallic connection layer. Together with the operating voltage, in particular in the case of organic light-emitting diodes the luminance achievable drops from the edge in the direction of an inner region of a light-emitting surface.

SUMMARY OF THE INVENTION

It is therefore an object of the invention to provide an organic light-emitting diode and a contact arrangement for a two-dimensional, optically active element which allows improved electrical connection of a layer stack or of an optically active element. Another object of the invention is to provide an organic light-emitting diode which allows uniform emission over the entire surface. A further object of the invention is to provide a method which is suitable for producing such a light-emitting diode.

These and other objects are attained in accordance with one aspect of the invention directed to an organic light-emitting diode which comprises a layer stack, the layer stack comprising at least one organic layer for emitting electromagnetic radiation and a first surface and a second surface opposite the first surface. The light-emitting diode further comprises an electrically conductive first connection layer, which is arranged on the first surface of the layer stack and connected electrically therewith. In addition, the light-emitting diode comprises an electrically conductive second connection layer which is at least predominantly transparent to electromagnetic radiation of a characteristic wavelength of the emittable electromagnetic radiation, which second connection layer is arranged on the second surface of the layer stack and connected electrically therewith. The light-emitting diode is characterised inter alia in that on the opposite side of the first connection layer from the layer stack there is arranged a conductive contact structure insulated electrically from said connection layer, the first connection layer comprises a plurality of openings and the second connection layer is connected electrically with the contact structure in the region of the plurality of openings of the first connection layer.

Using an additional, conductive contact structure on the opposite side of the first connection layer enables power supply through the first connection layer, for example from one side of a carrier substrate. In this way, an electrical potential may be provided for the second connection layer in the region of the plurality of openings. The conductive contact structure thus partially takes over the job of the second connection layer and effectively brings about an improvement in transverse conductivity.

According to one advantageous configuration, the contact structure comprises at least a first insulating layer and an electrically conductive third connection layer, wherein the first insulating layer is in direct physical contact with the side of the first connection layer remote from the layer stack and the third connection layer is in direct physical contact with the side of the first insulating layer remote from the first connection layer. By using a contact structure with a first insulating layer and an electrically conductive third connection layer, it is possible to realise a compact connection structure for supplying the required operating voltage.

According to a further advantageous development, the insulating layer takes the form of an electrically insulating carrier substrate and comprises a plurality of openings, which plurality is associated with the plurality of openings in the first connection layer. By using a carrier substrate with a plurality of openings, the mechanical and electrical structure of the organic light-emitting diode is further simplified.

According to a further advantageous development, the layer stack in each case comprises one recess in the region of the plurality of openings of the first connection layer and the second connection layer projects into these recesses, in order to contact the contact structure electrically. The provision of openings in the layer stack makes possible direct electrical contacting between the second connection layer and the contact structure.

According to a further advantageous development, a plurality of contact elements is arranged in the layer stack, which plurality is associated with the plurality of openings in the first connection layer and connects the second connection layer electrically with the contact structure. By using a plurality of contact elements in the layer stack, electrical connections are produced between the contact structure and the second connection layer.

According to a further advantageous configuration, each of the plurality of contact elements in each case surrounds an insulation layer, which insulates the respective contact element electrically from the layer stack. By using the insulation layers, it is possible to avoid unintentional electrical contacts or currents within the layer stack.

According to a further advantageous configuration, the second connection layer comprises a doped transition metal oxide, in particular indium-tin oxide or aluminium-doped zinc oxide. By using a doped transition metal oxide as second connection layer, it is possible to produce particularly light-transmitting connection layers.

According to a further advantageous configuration, the second connection layer comprises a thin metallic layer with a thickness of between 5 and 50 nm, in particular a metallic layer with a thickness of less than 30 nm. Use of a thin metallic layer as second connection layer allows an improved distribution of the operating voltage on the second surface of the layer stack.

According to a further advantageous configuration, the second connection layer additionally comprises at least one doped transition metal oxide layer, the thin metallic layer and the transition metal layer forming a composite structure. By using a connection layer comprising at least one thin metallic layer and at least one transition metal oxide layer, the transverse conductivity of the second connection layer may be improved while maintaining an acceptable transparency in comparison to a pure metallic layer. Also possible, for example, are sandwich structures with a thin metallic layer, which is arranged between two transition metal layers, or a transition metal oxide layer, which is arranged between two thin metal layers.

The underlying object is moreover achieved by a contact arrangement for a two-dimensional, optically active element with a first surface and a parallel second surface opposite the first surface.

According to at least one embodiment of the contact arrangement for a two-dimensional, optically active element with a first surface and a parallel second surface opposite the first surface, the contact arrangement comprises:

an electrically conductive first connection layer, which is arranged on the first surface of the optically active element and connected electrically therewith, and an electrically conductive second connection layer which is at least predominantly transparent to electromagnetic radiation of a predetermined characteristic wavelength, which second connection layer is arranged on the second surface of the optically active element and connected electrically therewith, wherein a conductive contact structure insulated electrically from the first connection layer is arranged on the opposite side of said first connection layer from the optically active element, the first connection layer comprises a plurality of openings and the second connection layer is connected electrically to the contact structure in the region of the plurality of openings in the first connection layer.

The contact arrangement may for example be used for a light-emitting diode described herein. This means that the features indicated in relation to the light-emitting diode are also disclosed for the contact arrangement described herein, and vice versa.

Another aspect of the invention is directed to a method for producing organic light-emitting diodes and other two-dimensional components, with the following steps:

providing a two-dimensional, electrically conductive first connection layer and a conductive contact structure arranged in the region of the first connection layer and insulated electrically therefrom, forming a plurality of openings in the first connection layer, two-dimensional application of a layer stack comprising at least one organic layer for the emission of electromagnetic radiation onto an opposite side of the first connection layer from the contact structure, two-dimensional application of an electrically conductive second connection layer predominantly transparent to a predetermined characteristic wavelength of the emittable electromagnetic radiation onto an opposite side of the layer stack from the first connection layer and forming a plurality of electrical connections between the second connection layer and the contact structure through the plurality of openings in the first connection layer.

By means of the above-stated method steps, electrical contacting of a two-dimensional second connection layer is made possible through a first connection layer by means of an additional contact structure.

An organic light-emitting diode described herein may be produced by means of the method. This means that the features described in relation to the light-emitting diode are also disclosed in relation to the method, and vice versa.

According to one advantageous configuration, the layer stack is initially applied to the entire surface of the first connection layer and in a following step parts of the layer stack, which are associated with the plurality of openings in the first connection layer, are removed. This two-dimensional application and subsequent partial removal of the layer stack enables particularly simple contacting of the second connection layer.

According to a further advantageous development, forming of the plurality of openings in the first connection layer is carried out jointly with removal of the parts of the layer stack. Through said joint forming of openings and removal of parts of the layer stack, production of the organic light-emitting diode is further simplified.

According to a further advantageous configuration, the parts of the layer stack are removed by the action of electromagnetic radiation, in particular by laser ablation. By removing parts of the layer stack through the action of electromagnetic radiation, production may proceed contactlessly without additional chemical or other intermediate steps.

According to a further advantageous configuration, the layer stack is applied with structuring, regions being relieved during application of the layer stack which are associated with the plurality of openings in the first connection layer, such that the layer stack likewise comprises a plurality of openings. If regions are relieved during application of the layer stack, subsequent introduction of openings into the layer stack may be avoided.

According to a further advantageous configuration, the layer stack is applied onto the first connection layer by screen printing. Using screen printing makes it simple to produce a layer stack with openings.

According to a further advantageous configuration, the layer stack is applied onto the first connection layer by means of vapour deposition, the regions to be relieved being masked by means of a shadow mask. Application of the layer stack by means of vapour deposition and an associated shadow mask enables uniform application of a layer stack with openings.

According to a further advantageous development, a plurality of contact elements is introduced into regions of the layer stack, which plurality is associated with the plurality of openings in the first connection layer. By introducing a plurality of contact elements, the contact structure may be connected electrically with the second connection layer through the layer stack.

According to a further advantageous configuration, the light-emitting diode comprises a carrier substrate and the first connection layer and/or the contact structure are applied to the carrier substrate by means of photolithography. By applying the first connection layer and/or the contact structure to a carrier substrate by means of photolithography, production of the organic light-emitting diode may be further simplified.

BRIEF DESCRIPTION OF THE DRAWINGS

FIG. 4 shows a cross-section through an organic light-emitting diode with a first contact arrangement according to a further exemplary embodiment, FIG. 5 shows a cross-section through an organic light-emitting diode with a second contact arrangement according to a further exemplary embodiment, FIG. 6 shows different options for texturing various contact arrangements according to different exemplary embodiments and FIG. 7 shows an exemplary embodiment of a flow chart of a method of producing organic light-emitting diodes and other two-dimensional components.

DETAILED DESCRIPTION OF THE DRAWINGS

Figure 1:
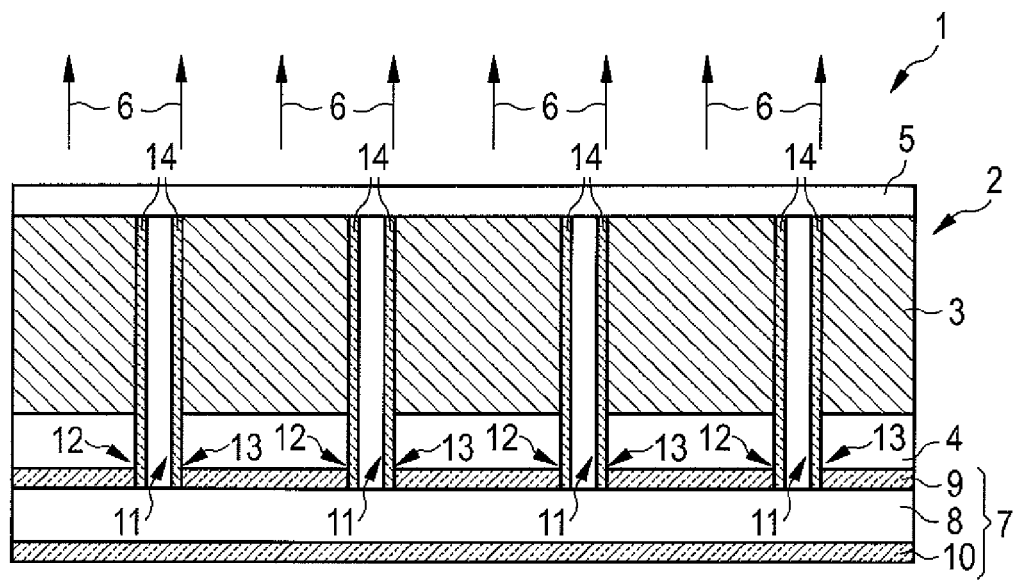
FIG. 1 shows a cross-section through an organic light-emitting diode with additional contact elements according to one exemplary embodiment.

FIG. 1 shows a cross-section through an organic light-emitting diode 1 according to one exemplary embodiment. The organic light-emitting diode 1 comprises a layer stack 2, which comprises at least one organic layer 3 for emitting electromagnetic radiation. The layer stack 2 may additionally contain further organic and inorganic layers, which are necessary or advantageous for forming a diode structure. Examples of such layers are layers for hole transport or electron transport, emitter layers, n-doped layers, p-doped layers, buffer layers and intermediate layers, as are known to a person skilled in the art. For reasons of clarity, such additional layers are, however, not shown in FIG. 1.

The layer stack 2 contains a functional region with one or more functional layers of organic materials. The functional layers may here for example take the form of electron transport layers, electroluminescent layers and/or hole transport layers. In the functional layers, electromagnetic radiation 6 of a single wavelength or a range of wavelengths may be generated in the active region by electron and hole injection and recombination. In this case, through the emission of narrow- or broad-band primary radiation, said primary radiation may evoke the impression of monochromatic, polychromatic and/or mixed-colour light on the part of the observer.

The functional layers may comprise organic polymers, organic oligomers, organic monomers, small organic, non-polymeric molecules ("small molecules") or combinations thereof. Suitable materials and arrangements and structuring of the materials for functional coatings are known to a person skilled in the art and are not therefore explained any further at this point.

The statement that a layer or an element is arranged or applied "on" or "over" another layer or another element may here and hereinafter mean that the one layer or the one element is arranged in direct mechanical and/or electrical contact with the other layer or the other element. It may moreover also mean that the one layer or the one element is arranged indirectly on or over the other layer or the other element. In this case, further layers and/or elements may then be arranged between the one layer and the other.

The organic light-emitting diode 1 according to FIG. 1 additionally comprises a first connection layer 4, which forms a first electrode for supplying power to the organic layer 3. For example the first connection layer 4 may be a metallic layer, which provides a very highly conductive cathode or anode structure for the organic light-emitting diode. In an advantageous configuration, the first connection layer 4 reflects electromagnetic radiation 6, which is generated in the organic layer 3 when the organic light-emitting diode 1 is in operation. In this way outcoupling of electromagnetic radiation may be concentrated in the direction of one surface of the organic light-emitting diode 1. An aluminium layer is suitable for this purpose, for example.

The first connection layer 4 may take the form of a cathode and thus serve as an electron-injecting material. Advantageous cathode materials may be inter alia in particular aluminium, barium, indium, silver, gold, magnesium, calcium or lithium and compounds, combinations and alloys thereof.

The first connection layer may be provided with structuring in electrode sub-regions. For example, the first connection layer 4 may take the form of first electrode strips arranged parallel next to one another. The first connection layer 4 is particularly preferably connected electrically conductively to a strip conductor. The connection layer 4 may for example merge into a first strip conductor or be separate from a first strip conductor and connected electrically conductively therewith.

The organic light-emitting diode 1 additionally comprises a second connection layer 5. The second connection layer 5 forms a second electrode for applying an operating voltage to the surface of the layer stack 2.

The second connection layer 5, which may for example take the form of an anode and may thus serve as hole-injecting material, may for example comprise a transparent, electrically conductive oxide or consist of a transparent conductive oxide. Transparent, electrically conductive oxides ("TCO" for short) are transparent, conductive materials, generally metal oxides, such as for example zinc oxide, tin oxide, cadmium oxide, titanium oxide, indium oxide or particularly preferably indium-tin oxide (ITO). In addition to binary metal-oxygen compounds, such as for example ZnO, $SnO_2$ or $In_2O_3$, ternary metal-oxygen compounds, such as for example $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent, electrically conductive oxides also belong to the TCO group. Furthermore, TCOs do not necessarily have to correspond to a stoichiometric composition and may also be p- or n-doped. For example the second connection layer 5 may be a layer of indium-tin oxide.

Indium-tin oxide and other doped transition metal oxides are at least partially transparent to electromagnetic radiation of a particular wavelength, in particular for electromagnetic radiation in the visible wavelength range, i.e. from 400 to 800 nm. In this way electromagnetic radiation 6 may also exit from the organic light-emitting diode 1 through the second connection layer 5, i.e. upwards in FIG. 1. The organic light-emitting diode 1 thus forms a large-area radiation emitter. In this way, for example, a material may be selected for the first connection layer 4 below the layer stack 2 irrespective of its optical characteristics.

The second connection layer 5 may alternatively or additionally also comprise metals and/or metal alloys and/or layer sequences, for example "IMI" layers (ITO/metal/ITO) or be made from those comprising at least one of the materials Ag, Al, Cr, Mo and Au.

Alternatively, the first connection layer 4 may take the form of an anode and the second connection layer 5 the form of a cathode with the above listed materials or combinations thereof. Furthermore, the connection layers 4 and 5 also comprise electrically conductive or semiconductive organic material.

The organic light-emitting diode according to FIG. 1 comprises a contact structure 7 which serves to feed an electrical voltage to the second connection layer 5. In the exemplary embodiment, the contact structure 7 is formed of a third connection layer 8, a first insulation layer 9 and a second insulation layer 10. The first insulation layer 9 insulates the third connection layer 8 electrically from the first connection layer 4. The second insulation layer 10 insulates the third connection layer 8 in a downward direction, for example relative to a carrier substrate not shown in FIG. 1. If the organic light-emitting diode 1 is arranged on a non-conductive carrier substrate, it is also possible to dispense with the insulation layer 10.

The third connection layer 8 may for example be constructed from the same materials as the first connection layer 4 or comprise these. The first and second insulation layers 9 and 10 may for example contain or be made from a polymer material or an oxide of a metal or semiconductor material. For example thin plastics films, silicon dioxide layers or known printed circuit board materials are suitable for this purpose.

The contact structure 7 further comprises a plurality of contact elements 11. In the exemplary embodiment shown in FIG. 1 the contact elements 11 are conductive webs, which are introduced into the organic layer stack 3. The contact elements 11 are passed through openings 12 in the first connection layer 4. The first insulation layer 9 likewise comprises openings for passage of the contact elements 11. The contact elements may for example be metallic webs with a diameter of approx. 10 µm. As an alternative, the use of highly conductive, non-metallic contact elements is, for example, also necessary. For example, carbon nanotubes or high temperature superconductors may be formed in the layer stack 2.

In order to insulate the contact elements 11 from the first connection layer 4 and the layer stack 2 surrounding them, each of the contact elements 11 is surrounded by a third insulation layer 14. For example, a metal or semiconductor material used to form the contact elements 11 may be partially oxidised or coated with an additional insulation material, in order to form a third insulation layer 14.

The organic light-emitting diode 1 illustrated in FIG. 1 allows largely uniform supply of the layer stack 2 with an operating current or an operating voltage. The first connection layer 4 consists to this end preferably of a metal material, which has very good conductivity. For example, the first connection layer 4 may be made from copper or aluminium.

The second connection layer 5 consists of a largely transparent material. Preferably, the second connection layer 5 consists of a doped transition metal or a very thin metallic layer. An indium-tin oxide layer with a thickness of between 20 and 150 nm has, for example, a transmittance of over 80% in the visible wavelength range, depending on the quality and purity of the material used. A metallic layer with a layer thickness of 5 to 50 nm, for example between 10 and 30 nm, achieves a transparency of over 70% in the visible range depending on layer thickness and material. Composite structures comprising at least one thin metallic layer and one transition metal oxide layer, may also be used. In addition, an antireflection layer may also be incorporated into the second connection layer 5, to increase the transparency thereof.

This ensures very efficient outcoupling of the electromagnetic radiation 6 out of the organic light-emitting diode 1 over the entire surface. However, such transparent connection layers 5 display only relatively slight transverse conductivity. By multiple electrical contacting of the second connection layer 5 by way of the contact elements 11, a fall in operating voltage along the surface of the organic light-emitting diode 1 may nevertheless be kept to a minimum, such that uniform power supply may be achieved over the entire surface and the impression of a light-emitting surface of uniform brightness is obtained.

Conventional encapsulation of the light-emitting diode 1 in the form of a thin-film encapsulation or of a cover is not shown in FIG. 1 for reasons of clarity but is not ruled out. For example, the use of a wavelength conversion layer in an encapsulation arrangement is advantageous, in order for example to prevent differential colour ageing, which may occur when a plurality of different active regions are used to generate mixed light. On the other hand, the colour location of the light impression made by the optoelectronic component may be optimised irrespective of the electronic characteristics of the radiation-emitting layer sequence.

In particular, the light-emitting diode 1 may emit superimposed primary radiation and secondary radiation if a conversion layer is used. In this case, part of the primary radiation may pass through the wavelength conversion layer unconverted and exit from an encapsulation arrangement. Furthermore, electromagnetic secondary radiation may also exit from the encapsulation arrangement and be emitted thereby. An external observer may therefore perceive a mixed-colour light impression as a result of the superimposition of the electromagnetic primary radiation and electromagnetic secondary radiation. The mixed-colour light impression may here depend on the relative proportions of the primary radiation and secondary radiation. The primary radiation and the secondary radiation may comprise wavelength ranges which differ from one another. In this way a mixture of for example different colours of electromagnetic radiation 6 may be produced, leading to overall radiation with the desired, resultant colour.

Through the optional use of thin connection layers 4, 5 and 7, for example thin metallic layers, and, if present, of a flexible carrier substrate, for example a thin plastics film, flexible components, in particular flexible organic light-emitting diodes, may also be produced.

Figure 2:
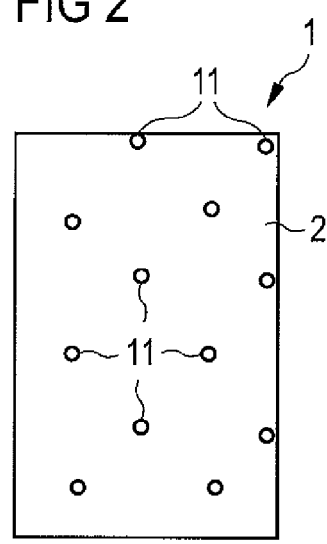
FIG. 2 shows a first plan view of an organic light-emitting diode with a first arrangement of contact elements according to a further exemplary embodiment.
Figure 3:
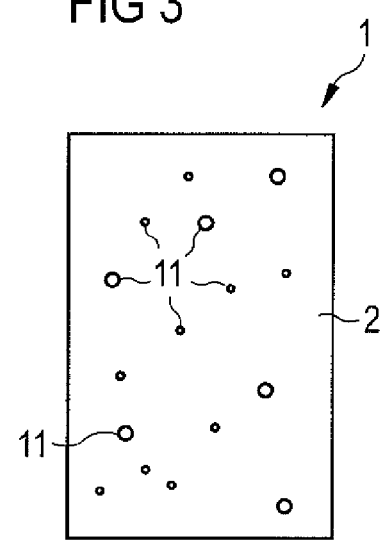
FIG. 3 shows a second plan view of an organic light-emitting diode with a second arrangement of contact elements according to a further exemplary embodiment.

FIGS. 2 and 3 show two plan views of organic light-emitting diodes 1 with differently arranged contact elements 11. According to a further exemplary embodiment shown in FIG. 2, a plurality of contact elements 11 are distributed uniformly over a surface of the layer stack 2. For example, metallic webs of identical diameter are introduced into the layer stack 2 in the densest hexagonal packing arrangement.

According to a further exemplary embodiment shown in FIG. 3, an alternative arrangement of the contact elements 11 is used. According to FIG. 3 contacting of the second connection layer 5 was achieved by means of a plurality of stochastically arranged contact elements 11, for example by diffusion of conductive materials into the layer stack 2. Both the position of the individual contact elements 11 and the precise shape thereof and the diameter thereof here depend on random distribution.

Depending on the configuration of the contact elements 11 the connecting webs may have a diameter of approx. 100 nm up to a few micrometers. In this case, the distance between the individual contact elements 11 is such that for an observer of the organic light-emitting diode 1 the impression of a homogeneous light-emitting surface is obtained. The better the transverse conductivity of the second connection layer 5, the greater may be the distance between the individual contact elements 11. For the production of large-area organic light-emitting diodes, distances of a few millimeters up to a few centimeters are typically possible and advantageous.

The contact elements 11 shown in FIG. 1 may be produced, for example, by introducing additional webs or the partial conversion of a layer stack 2. Alternatively, an electrical connection between the second connection layer 5 and the contact structure 7 may also be produced by structured application of different layers. This is described in more detail below with reference to FIGS. 4 and 5.

FIG. 4 shows a contact arrangement 15 according to a further configuration of the invention. The contact arrangement 15 comprises a layer stack 2 with an organic layer 3. A first connection layer 4 is arranged on the bottom of the organic layer 3. A second connection layer 5 is arranged on a surface of the layer stack 2 opposite the first connection layer 4. The individual layers may be made from or contain materials described with reference to FIG. 1. For example the first connection layer 4 comprises a metal and the second connection layer 5 comprises indium-tin oxide.

A contact structure 7 is arranged below the first connection layer 4. The contact structure 7 comprises an insulation layer 9 and a third connection layer 8, which is arranged below the insulation layer 9 and consists for example of a metallic conductor material. At the left- and right-hand edges of FIG. 4 the layers 8, 9, 4, 3 and 5 form a layer stack, the organic layer 3 being enclosed between the first connection layer 4 and the second connection layer 5 in a sandwich structure, which forms an organic light-emitting diode structure, for example.

In the middle region of FIG. 4 a contact point 17 is shown, which serves in connecting the second connection layer 5 electrically with the third connection layer 8. A recess 16 is provided in this region, into which the second connection layer 5 penetrates. In particular, both the insulation layer 9 and the first connection layer 4 comprise an opening in this region, such that in the cross-section shown these layers are interrupted in the region of the recess 16. The organic layer 3 also comprises an opening, which forms the recess 16. The second connection layer 5 is applied in two-dimensional manner to the layer stack 2 shown in FIG. 4, such that the second connection layer 5 penetrates into the recess 16 and produces an electrical contact with the third connection layer 8. For example, layers 3, 4 and 9 may be removed in the region of the recess 16 by micromachining steps, for example by laser ablation, before the second connection layer 5 is applied to the contact arrangement 15.

FIG. 5 shows a further exemplary embodiment of a contact arrangement 15 for a layer stack 2. The contact arrangement 15 comprises a third connection layer 8, an insulation layer 9, a first connection layer 4, an organic layer 3 and a second connection layer 5. The sequence of layers thus comprises the same layers as the sequence of layers shown in FIG. 4 and is made from the same materials, for example.

The contact arrangement 15 according to FIG. 5 comprises a recess 16 in the region of a contact point 17. The second connection layer 5 penetrates into the recess 16 and thus forms an electrical contact with the third connection layer 8. An opening 13 present in the insulation layer 9 is smaller in FIG. 5 than in the case of the contact arrangement shown in FIG. 4. While in the contact arrangement 15 according to FIG. 4 the second connection layer 5 lies at all points on the organic layer 3 apart from the electrical contact with the third connection layer 8, the second connection layer 5 according to FIG. 5 lies to the left and right of the contact point on the insulation layer 9. In this way electrical insulation between the connection layers 4 and 8 is improved, such that the probability of a short-circuit occurring in the region of the contact arrangement is reduced. Moreover, in this way a more uniform electrical field may be generated within the layer stack 2, such that a uniformly light-emitting surface also arises in the region of the contact structure 7.

In FIGS. 1 to 5 the contact elements 11 or contact points 17 were shown as punctiform, in particular circular, contacts. Other shapes are also possible for forming contacts, however. In the further exemplary embodiments according to FIGS. 6A to 6C, other options for contacting between the second connection layer 5 and the contact structure 7 are illustrated.

Figure 6A:
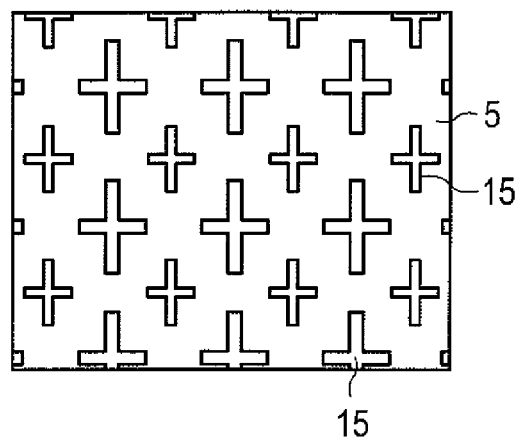
Figure 6B:
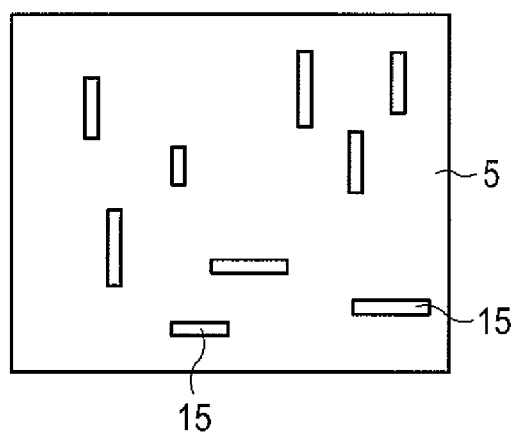
Figure 6C:
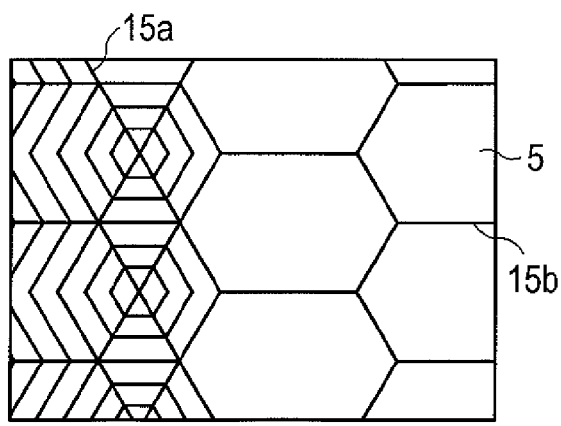

FIG. 6A shows cross-shaped contact arrangements 15. Cross-shaped contact arrangements 15 have the advantage, inter alia, of making possible a relatively large current flow between the connection layer 8 and the second connection layer 5. FIG. 6B shows strip-shaped contact arrangements 15. Strip-shaped contact arrangements 15 may be introduced in a particularly simple manner into a layer stack 2. For example, cuts may be introduced into the organic layer 3, the first connection layer 4 and the first insulation layer 9. FIG. 6C shows spider's web-like contacts 15a or honeycomb-like contact arrangements 15b. Spider's web-like contacts 15a or honeycomb-like contact arrangements 15b allow regular and uniform supply of the second connection layer 5 with an electrical operating current to operate an organic light-emitting diode or another optically active element.

One advantage of the above-described arrangements consists in the fact that lateral current distribution over the entire light-emitting surface may proceed as a result of a highly conductive contact structure 7 or connection layer 8. Since this may be made from a material of any desired thickness which may also not be transparent, it is possible in principle, with the described arrangement, to supply areas of any desired size with an operating current. For example, a sandwich structure, consisting of a first connection layer 4, the first insulation layer 9 and the third connection layer 8 may be used. Such sandwich structures with two metallic layers and one insulating layer are simple to produce. For example, strip conductors may be produced lithographically on the top or bottom of a conductive material. Alternatively, it is also possible to use a laminate of two metallic layers and a plastics layer located therebetween.

FIG. 7 shows an exemplary embodiment of a method of producing organic light-emitting diodes and other two-dimensional components with at least one optically active element, in particular inorganic light-emitting diodes, two-dimensional radiation detectors or solar cells.

In a first step 71a first connection layer 4 is provided. The first connection layer may be provided for example on a carrier substrate for the light-emitting diode to be produced. This may for example be a ceramic carrier substrate. Alternatively, it is also possible to use a printed circuit board or another suitable carrier material. It may optionally also be possible to dispense with the use of a carrier substrate, in particular if the first connection layer 4 is formed for example from a metallic layer or foil. Moreover, a third connection layer 8 is provided, which is insulated electrically from the first connection layer 4 and is arranged in two-dimensional manner thereon. For example, the first connection layer 4 and the third connection layer 8 may already be arranged on a carrier substrate or subsequently applied onto a carrier substrate over the course of the method, for example by means of photolithography or coating. It goes without saying that it is also possible to adhesively bond conductive metal foils to a non-conductive carrier substrate or to attach them in some other way.

In a further step 72, openings 12 are formed in the first connection layer 4 and optionally openings 13 in the insulation layer 9. The openings make it possible to achieve contact between the first connection layer 4 and a subsequently applied second connection layer 5. The openings 12 or 13 may be formed in the first connection layer 4 or the first insulation layer 9 by mechanical, micromechanical or chemical methods. For example, holes may be drilled, milled, etched or burned into the first connection layer 4 and/or the first insulation layer 9.

In a further method step 73 a layer stack with at least one organic layer 3 is applied to the first connection layer 4. The organic layer stack 2 is applied onto a bare surface of the first connection layer 4, such that a first electrical contact is produced between the first connection layer 4 and the layer stack 2.

In principle, the layer stack 2 may firstly be applied over the entire area of the first connection layer 4. Contact elements 11 may optionally subsequently be introduced into the organic layer 3 or recesses 16 formed in the layer stack 2. It is alternatively also possible to apply the organic layer 3 only in the regions which are not associated with any opening 12 or 13 in the first connection layer 4 or insulation layer 9.

According to the first alternative the layer stack 2 is applied over, for example sputtered onto, the entire area of the first connection layer 4. Then the parts of the layer stack 2 which are associated with the openings 12 or 13 in the first connection layer 4 or insulation layer 9 are removed for example by means of laser ablation. According to the second alternative the organic layer 3 is applied for example by means of screen printing, the regions associated with the openings 12 or 13 being relieved by the screen printing process. Furthermore, it is also possible to vapour deposit the layer stack 2 onto the first connection layer 4 using vacuum diffusion technology, the regions associated with the openings 12 or 13 being relieved by means of a shadow mask.

According to a modified configuration, instead of the layer stack 2 with the organic layer another, for example also an inorganic layer stack, for example comprising a semiconductor material, is applied, grown epitaxially or formed by other methods known from the prior art. In this way, solar cells, radiation detectors for detecting electromagnetic radiation or other electronic components with a two-dimensional, optically active region, may for example also be produced.

In a further step 74 the second connection layer 5 is applied onto the layer stack 2. For example, an indium-tin oxide layer may be vapour-deposited or grown onto the surface of the layer stack 2 or deposited thereon. The second connection layer 5 is in this case applied over a large area in the region of the entire layer stack 2.

In a last step 75 electrical connections are formed between the second connection layer 5 and the third connection layer 8. If recesses 16 are provided in the layer stack 2, this step is carried out jointly with step 74. This means that, by applying the second connection layer 5, electrical contacting of the third connection layer 8 also takes place simultaneously in the region of the openings 12. Alternatively it is also possible to form electrical connections between the second connection layer 5 and the third connection layer 8 by introducing additional contact elements 11 into the layer stack 2. For example, thin metal pins may be introduced into the layer stack 2. Metal pins of silver with a diameter of less than 20 nm are suitable for this purpose, for example.

The above-described steps may also be carried out in a different order from that described above. For example, the layer sequence may be built up in reverse order, i.e. beginning with a top electrode formed by the second connection layer 5, over the layer stack 2, the first connection layer 4, the insulation layer 9 and the third connection layer 8. Moreover, a plurality of the method steps may be combined into one individual step. For example, the openings 12 and 13 in the first connection layer 4 and the first insulation layer 9 may be produced jointly with the recesses 16 in the layer stack 2.

In the exemplary embodiments described, the third connection layer 8 was described as an additional metallic or other conductor layer, which has been applied in two-dimensional manner to an insulation layer 9. Instead of a two-dimensional contact structure 7 it goes without saying that other contact elements may also be arranged on a side of the first connection layer 4 remote from the layer stack 2, which ensure uniform supply of the second connection layer 5 with an electrical operating current. For example, individual contact elements 11 may be connected to a power source by means of strip conductors or cable connections.

Finally, individual features of the described exemplary embodiments may be combined with one another to achieve further possible configurations.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. An organic light-emitting diode comprising:
a layer stack having at least one organic layer for emitting electromagnetic radiation, the layer stack having a first surface and a second surface opposite the first surface;
an electrically conductive first connection layer, which is arranged on the first surface of the layer stack and connected electrically therewith; and
an electrically conductive second connection layer which is at least predominantly transparent to a characteristic wavelength of the emittable electromagnetic radiation, which second connection layer is arranged on the second surface of the layer stack and connected electrically therewith,
wherein a conductive contact structure insulated electrically from the first connection layer is arranged on the opposite side of said first connection layer from the layer stack,
wherein the first connection layer comprises a plurality of openings,
wherein the second connection layer is connected electrically to the contact structure through the region of the plurality of openings in the first connection layer,
wherein the contact structure comprises at least a first insulating layer and an electrically conductive third connection layer, the first insulating layer being in direct physical contact with the side of the first connection layer remote from the layer stack and the third connection layer being in direct physical contact with the side of the first insulating layer remote from the first connection layer,
wherein the first insulating layer is formed as an electrically insulating carrier substrate and comprises a plurality of openings, which are associated with the plurality of openings in the first connection layer,
wherein the second connection layer covers the at least one organic layer, the plurality of openings of the first connection layer and the plurality of openings of the carrier substrate,
wherein the electromagnetic radiation exits from the organic-light emitting diode through the second connection layer,
wherein a plurality of contact elements is arranged in the layer stack,
wherein each one of the plurality of contact elements is surrounded by an insulation layer such that the respective contact element is insulated electrically from the layer stack, wherein the insulation layer directly adjoins the organic layer, the first connection layer and the electrically insulating carrier substrate formed by the first insulating layer, and wherein the insulation layer directly adjoins the first insulating layer at a boundary surface between the insulation layer and the first insulating layer.

2. The organic light-emitting diode according to claim 1, wherein the layer stack in each case comprises one recess in the region of the plurality of openings in the first connection layer and the second connection layer projects into these recesses, in order to contact the contact structure electrically.

3. The organic light-emitting diode according to claim 1, wherein the plurality of contact elements is associated with the plurality of openings in the first connection layer and connects the second connection layer electrically with the contact structure.

4. The organic light-emitting diode according to claim 3, wherein the plurality of contact elements are strip-shaped or cross-shaped.

5. The organic light-emitting diode according to claim 3, wherein the plurality of contact elements are electrically conductive and non-metallic, and wherein carbon nanotubes are formed in the layer stack.

6. The organic light-emitting diode according to claim 1, wherein the second connection layer comprises a doped transition metal oxide.

7. The organic light-emitting diode according to claim 6, wherein the second connection layer comprises an indium-tin oxide or aluminium-doped zinc oxide.

8. The organic light-emitting diode according to claim 1, wherein the second connection layer comprises at least one thin metallic layer with a thickness of between 5 and 50 nm.

9. The organic light-emitting diode according to claim 8, wherein the second connection layer additionally comprises at least one doped transition metal oxide layer, the thin metallic layer and the transition metal oxide layer forming a composite structure.

10. The organic light-emitting diode according to claim 8, wherein the second connection layer comprises at least one thin metallic layer with a thickness of less than 30 nm.

11. An organic light-emitting diode comprising:

a layer stack having at least one organic layer for emitting electromagnetic radiation, the layer stack having a first surface and a second surface opposite the first surface;

an electrically conductive first connection layer, which is arranged on the first surface of the layer stack and connected electrically therewith; and an electrically conductive second connection layer which is at least predominantly transparent to a characteristic wavelength of the emittable electromagnetic radiation, which second connection layer is arranged on the second surface of the layer stack and connected electrically therewith, wherein a conductive contact structure insulated electrically from the first connection layer is arranged on the opposite side of said first connection layer from the layer stack, wherein the first connection layer comprises a plurality of openings, wherein the second connection layer is connected electrically to the contact structure in the region of the plurality of openings in the first connection layer, wherein the contact structure comprises at least a first insulating layer and an electrically conductive third connection layer, the first insulating layer being in direct physical contact with the side of the first connection layer remote from the layer stack and the third connection layer being in direct physical contact with the side of the first insulating layer remote from the first connection layer, wherein electrical connections between the second connection layer and the third connection layer are formed by contact elements, said contact elements being metal pins which are introduced into the layer stack.

* * * * *